United States Patent [19]

Schriber

[11] 4,291,242
[45] Sep. 22, 1981

[54] DRIVER CIRCUIT FOR USE IN AN OUTPUT BUFFER

[75] Inventor: Gene A. Schriber, Austin, Tex.
[73] Assignee: Motorola, Inc., Schaumburg, Ill.
[21] Appl. No.: 41,227
[22] Filed: May 21, 1979
[51] Int. Cl.³ .............. H03K 5/135; H03K 17/10; H03K 17/284; H03K 19/096
[52] U.S. Cl. .................. 307/270; 307/475; 307/481; 307/578
[58] Field of Search ......... 307/205, 208, 251, 262, 307/269, 270, DIG. 1, DIG. 4

[56] References Cited

U.S. PATENT DOCUMENTS

| | | | |
|---|---|---|---|
| 3,575,613 | 4/1971 | Ebertin | 307/DIG. 4 X |
| 3,835,457 | 9/1974 | Yu | 307/DIG. 1 X |
| 3,868,657 | 2/1975 | Hoffman et al. | 307/DIG. 4 X |
| 3,906,464 | 9/1975 | Lattin | 307/DIG. 4 X |
| 4,061,933 | 12/1977 | Schroeder et al. | 307/270 X |
| 4,122,361 | 10/1978 | Clemen et al. | 307/251 X |
| 4,239,991 | 12/1980 | Hong et al. | 307/DIG. 4 X |

OTHER PUBLICATIONS

Arzubi, "In-Phase Driver Circuit"; *IBM Tech. Discl. Bull.;* vol. 19, No. 1, pp. 31-32; 6/1976.
Cox et al., "An Fet 4-Phase Dynamic Off-Chip Driver with Polarity Hold"; *IBM Tech. Discl. Bull.;* vol. 17, No. 2, pp. 466-467; 7/1974.

*Primary Examiner*—Larry N. Anagnos
*Attorney, Agent, or Firm*—Joe E. Barbee

[57] ABSTRACT

A high speed, low power clocked driver circuit is provided. DC paths from voltage $V_{DD}$ to ground is eliminated by carefully clocking field effect transistors within the driver circuit. By using bootstrapping techniques, the output of the circuit approaches $V_{DD}$. Two of the high speed, low power driver circuits are combined to drive a ratioless output circuit in order to provide an output buffer circuit having a TTL compatible output.

7 Claims, 3 Drawing Figures

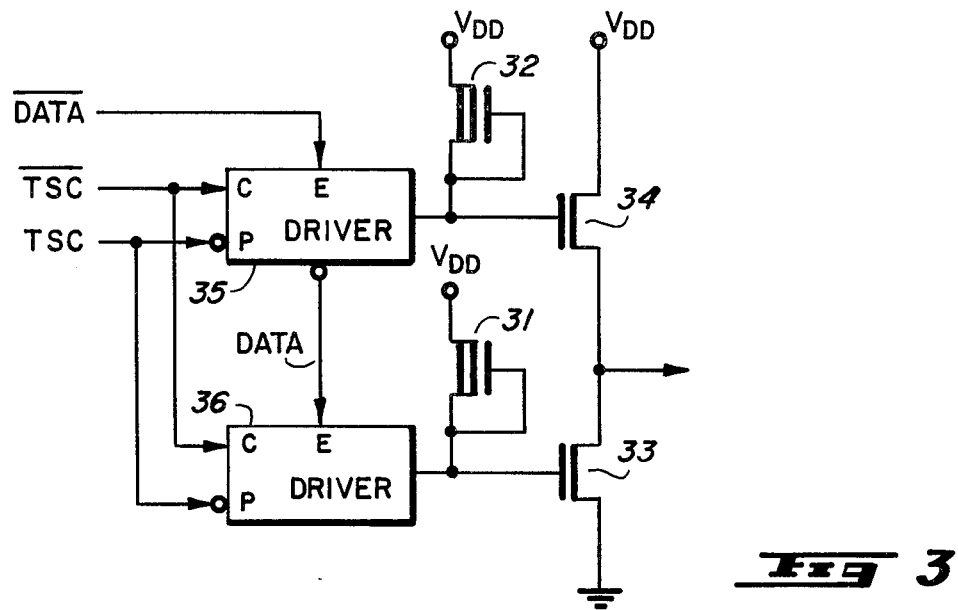
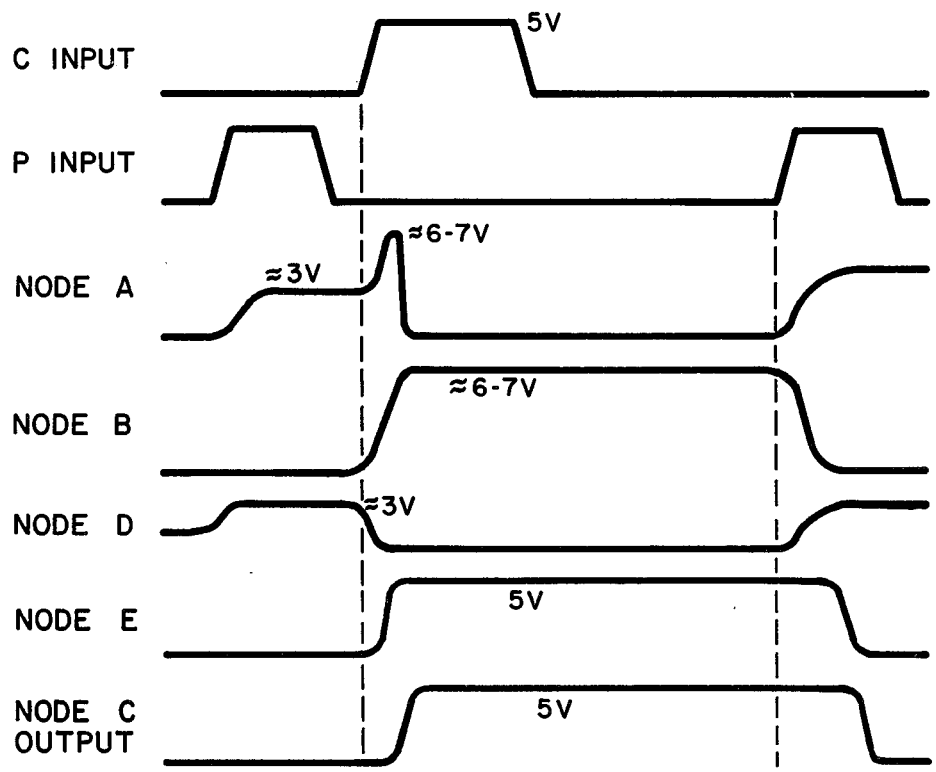

_

DRIVER CIRCUIT FOR USE IN AN OUTPUT BUFFER

BACKGROUND

This application relates, in general, to buffer circuits and, more particularly, to low power, high speed buffer circuits for use, for example, in integrated circuit logic devices.

As the technology for producing large scale integration devices advances, logic designers who design devices such as microprocessors and microcomputers, have the capability of producing integrated circuit chips having ever increasing numbers of active devices such as MOS field effect transistors on a single piece of silicon. The increased number of devices on a chip is accomplished in part by reduction of device geometries so that the devices themselves are smaller. Large scale logic circuits must operate at relatively high speed to be economic and useful. High speed may be obtained by a number of methods, and having smaller device geometries contributes to high speed operation. High speed operation usually also implies, however, relatively high power consumption.

As more and more devices are fabricated on a single integrated circuit chip operating at high speed, power consumption requirements and power dissipation requirements become extremely important.

Accordingly, it is an object of the present invention to provide a buffer circuit used with microprocessors which is capable of fast response and high speed operation but yet dissipates substantially less power than previously used devices.

Another object of the present invention is to provide a clocked driver circuit which is high speed and consumes a low amount of power and is useful in a buffer circuit.

SUMMARY OF THE INVENTION

In carrying out the above and other objects of the invention in one form, there is provided a high speed driver circuit having inputs for receiving a clocking signal, a precharge signal, and an enable signal. The driver circuit has first means which are coupled between the enable signal input and a first node. The first means is used to precharge the first node. Second means are coupled to the first node and can be enabled by the precharge signal or by the clocking signal. The second means is used to discharge the first node. An inverter is coupled to the enable signal input and provides an inverted enable signal output. Third means is coupled to the first node to maintain the first node in a discharged condition when the third means is enabled by the output of the inverter. Fourth means is coupled to the second node for precharging the second node. Fifth means provides an output which is coupled to the second node for boosting or bootstrapping the precharging of the second node. The fifth means has an input which is coupled to the second means. Sixth means is coupled to the second node for discharging the second node when the sixth means is enabled by the output of the inverter. An output means provides an output for the high speed driver circuit and has a first and a second input. The first input of the output means is coupled to the second node and the second input of the output means is coupled to the second means. Seventh means is coupled to the output of the output means and has an input coupled to the output of the inverter to maintain the output of the output means in a static state when the seventh means is enabled by the output of the inverter.

The above described driver circuit is used along with a second driver circuit to form an output buffer circuit. The output buffer circuit also includes a pair of series connected transistors having an output node thereinbetween which provides the output for the output buffer. The pair of series connected transistors has a first and a second input. The first input is coupled to the driver circuit and the second input is coupled to the second driver circuit. The enable signal input of the second driver circuit is coupled to the output of the inverter in the first driver circuit. Light depletion type transistors can be added to the first and second inputs of the series connected pair of transistors to ensure a static TTL compatible output level from the output buffer.

BRIEF DESCRIPTION OF THE DRAWINGS

FIG. 2 is a waveform diagram showing waveforms at various nodes of the circuit of FIG. 1; and FIG. 3 is a block diagram showing an output buffer utilizing two of the circuits shown in FIG. 1.

DETAILED DESCRIPTION OF THE DRAWINGS

Figure 1:
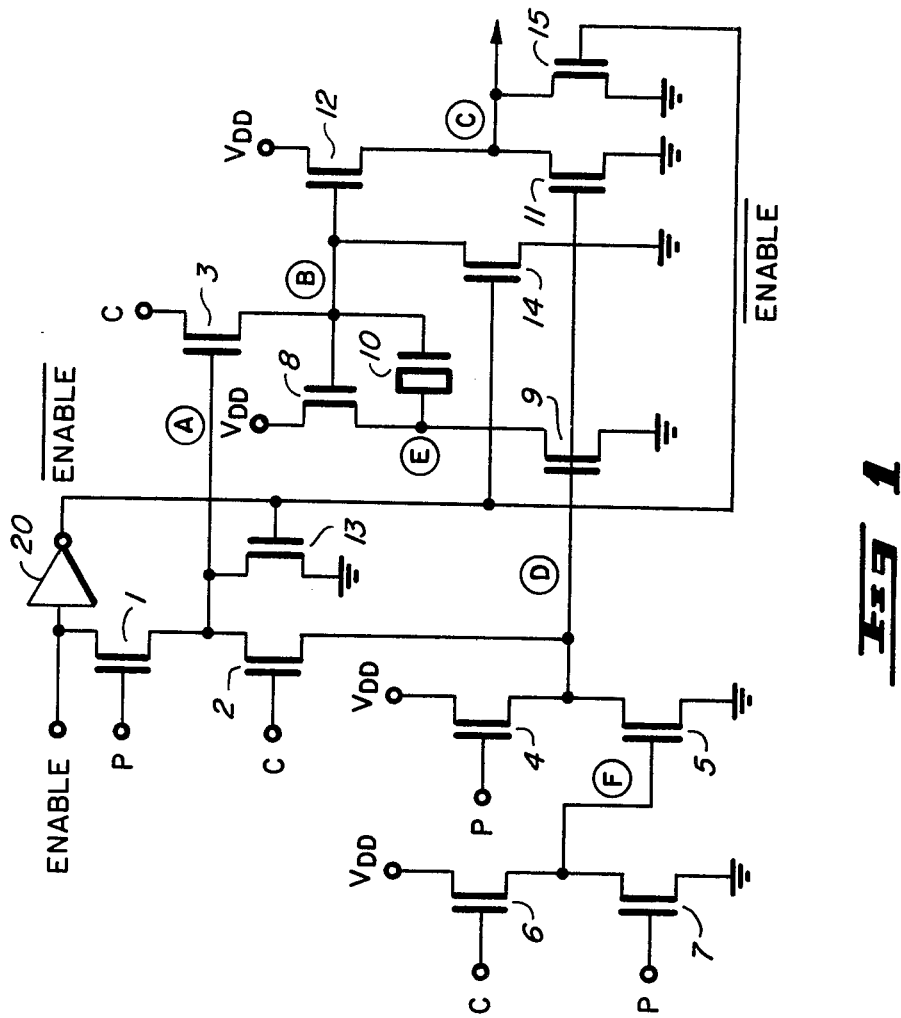
FIG. 1 is a schematic diagram showing a clock driver circuit according to the present invention.

FIG. 1 shows a schematic diagram of a clock driver circuit according to the instant invention. A similar circuit is disclosed in U.S. Pat. No. 4,061,933, which issued to Schroeder et al, the distinctions between the two circuits will be pointed out subsequently. Clock driver stages as generally shown in FIG. 1 are utilized in the design of logic devices to reduce the capacitive loading on the master clock signals of the circuit which, for example, may be a microprocessor (MPU). The master clock in such a device is usually routed to many different elements such as registers and gates in various locations on the silicon chip. Buffer devices, in particular, are relatively large devices in order to carry the power necessary to produce acceptable TTL levels at the interface outputs of the microprocessor. TTL levels are desirable for ease in interfacing the MPU or silicon chip to other external elements. Since the buffers are relatively large the capacitance of a gate of the output buffers is rather large and may be in a typical case on the order of 2 to 3 picofarads. Since the buffer stages are clock elements, the loading on the master clock circuitry of the MPU will be severe. Interposing a clock driver stage between the clock and the buffer reduces the loading since the capacitance of the driver circuit is substantially less than the capacitance of the buffer transistors themselves.

The driver circuit illustrated in FIG. 1 receives three input signals. These three signals are an enable signal, a clocking signal C, and a precharging signal P. A first pair of field effect transistors 6 and 7 are connected in series between a first voltage terminal illustrated as $V_{DD}$ and a second voltage terminal illustrated as ground. The gate electrode of transistor 6 is coupled to clocking input signal C and the gate electrode of transistor 7 is coupled to precharging signal input P. Transistors 6 and 7 form an output node F which is coupled to the gate electrode of a field effect transistor 5. Transistor 5 is coupled in series with transistor 4 between voltage terminal $V_{DD}$ and ground. Transistor 4 has its gate electrode coupled to precharging input P. Transistors 4 and 5 form an output node D. A field effect transistor 2 is coupled between node D and node A. Transistor 2 has its gate electrode connected to clocking signal input C. A field effect transistor 1 is coupled between node A and ENABLE input. Transistor 1 has its gate electrode coupled to the precharging input P.

The ENABLE input not only goes to the drain electrode of transistor 1 but also goes to the input of inverter 20. The inverted output from inverter 20 goes to the gate electrodes of three transistors which will be discussed hereinafter. A field effect transistor 13 is coupled from node A to ground and has its gate electrode connected to the output of inverter 20. The output of inverter 20 also goes to the gate electrode of a transistor 14 which is coupled from node B to ground. A field effect transistor 3 is coupled from clocking signal input C to node B and has its gate electrode connected to node A. A pair of field effect transistors 8 and 9 are connected in series from voltage terminal $V_{DD}$ to ground. Transistor 8 has its gate electrode connected to node B and transistor 9 has its gate electrode connected to node D. An output node E is formed between transistors 8 and 9. Output node E is coupled by capacitor 10 to node B. In a preferred embodiment, capacitor 10 is a field effect transistor having its gate electrode connected to node B and having its source and drain electrodes connected to node E and serving as a capacitor. Another pair of field effect transistors 11 and 12 are connected in series between voltage $V_{DD}$ and ground. The gate electrode of transistor 12 is coupled to node B while the gate electrode of transistor 11 is coupled to node D. An output node C is formed between transistors 11 and 12 and serves as the output for the driver circuit of FIG. 1. A field effect transistor 15 is coupled from node C to ground and has its gate electrode connected to the output of inverter 20.

The operation of the driver circuit illustrated in FIG. 1 will now be explained and it may be helpful to make reference to FIG. 2 in conjunction with FIG. 1. FIG. 2 illustrates some voltage versus time waveforms of signals at various nodes including the inputs C and P of FIG. 1. Assume ENABLE is high, in which case the circuit will function as though transistor 1 were connected directly to $V_{DD}$. When the precharge clock (P) goes to a high state, node A is pre-conditioned to approximately three volts (assuming $V_{DD}$ is 5 volts). The three volts is $V_{DD}$ minus the threshold voltage $V_{TE}$ of transistor 1. Node F is pulled low allowing node D to pull up to approximately three volts ($V_{DD}$ minus $V_{TE}$ of transistor 4). This places the output node C at a low level. Since the clocking signal input C to transistor 3 is at a low level, and node A is at approximately three volts, node B is also held low ensuring that transistor 12 is off. The output level (node C) is held at zero volts since transistor 12 is not conducting. When the P input signal goes low, nodes A and D will remain for a short period of time at approximately three volts due to charge storage.

If the clock input C goes high before the stored charge drains off nodes A and D, then a bootstrapping action will occur on node A due to the gate-drain capacitance of transistor 3. This allows node A to rise to approximately six to seven volts thereby allowing node B to rise toward $V_{DD}$. During this period of time, node F rises to approximately three volts which pulls node D to ground and pulls node A to ground via transistor 2. The timing of node A being pulled to ground is critical with respect to transistor 9 turning off. To obtain good bootstrapping action at node B, node A must be allowed to bootstrap as high as possible and then be pulled low as quickly as possible to ensure transistor 3 does not reverse the flow of current from node B when it rises higher than the voltage potential of clocking signal C. If the timing is proper, then node B will go to a high impedance state during the time node E rises and will further bootstrap node B up toward approximately seven volts through capacitor 10. This allows output node C to rise to five volts since the threshold voltage $V_{TE}$ of transistor 12 has been overcome by the high voltage swing at node B.

Node B is dynamic and relies upon charge storage. If clocking signal C goes low, the output at node C will remain in the high state until the charge at node B leaks off. When the precharging input P goes high again, node C will be forced to ground due to node D rising to approximately three volts and the process repeats itself as previously stated.

The discussion of the operation of the driver circuit thus far has been only referenced to a circuit as shown in FIG. 1 without inverter 20 and the transistors 13, 14, and 15 associated therewith. It was assumed during the explanation of operation, as previously noted, that the source of transistor 1 was connected directly to $V_{DD}$.

In many cases, it is desirable to have the precharging input P and the clocking input C clock inputs periodic, but to generate an output that is not periodic. If the precharging of node A is controlled with an ENABLE input, one can selectively allow node C to produce an output only when the ENABLE input is high during the precharge interval.

If the ENABLE input is held low during the precharge time (when P input is high) and during the following clock time (when C input is high) node A will not be allowed to precondition itself to the three volt level. Node A will be placed in a low impedance state during the precharge time due to transistors 1 and 13. During the time when clocking input C is high, transistor 1 is off and transistor 13 gives additional insurance that node A is at a low impedance state. Because of this, node A will not be bootstrapped which results in no transfer of clocking input C to node B via transistor 3. To further insure that node B and node C do not rise above ground, transistors 14 and 15 have been added. Transistor 14 ensures no bootstrapping action on node B during the time node E is rising. Transistor 15 is simply a safeguard to discharge and hold output node C low when ENABLE is low. Transistor 15 could be omitted if desired.

It should be noted that with the configuration as shown in FIG. 1, i.e., with transistor 13, 14 and 15 and inverter 20 present, the circuit does not allow a DC current path to exist anywhere from $V_{DD}$ to ground. If the drain electrode of transistor 1 were connected to $V_{DD}$, then if precharging input P were high and ENABLE were low, a DC path would exist between $V_{DD}$ and ground via transistors 1 and 13, since ENABLE is inverted by inverter 20 which would forward bias transistor 13. With the circuits of the prior art, specifically the circuit shown in Patent No. 4,061,933 noted above, a DC path from $V_{DD}$ to ground is possible and such a path would be wasteful of power.

FIG. 3 shows an output buffer capable of driving transistor-transistor logic (TTL) and utilizing a pair of the driver circuits shown in FIG. 1. In FIG. 3, the ENABLE input is represented by $\overline{DATA}$. Thus the ENABLE signal is a function of DATA appearing on the input of the buffer. The transistors 31 and 32 are, in the preferred embodiment, light depletion type transistors which insure static TTL output levels. Transistors 31 and 32 serve as high impedance devices which hold the gate electrodes of output transistors 33 and 34 at $V_{DD}$ after internally stored charges have leaked off and driver circuits 35 and 36 are not trying to pull the gate electrodes of transistors 33 and 34 low. Transistors 33 and 34 are the output transistors and are relatively large enhancement transistor devices which do not have to be ratioed.

DATA is applied to driver circuit 35 as the ENABLE signal. As explained hereinbefore, driver circuit 35 and driver circuit 36 are identical to the driver circuits of FIG. 1 and as shown in FIG. 1, the enable input is inverted by an inverter 20. The output of the inverter is coupled to the ENABLE input of driver circuit 36. A timing signal TSC is applied to the clocking signal input C of driver circuits 35 and 36. Timing signal TSC is applied to the precharging input P of driver circuits 35 and 36. The output of driver circuit 35 is coupled to the gate electrode of output pullup transistor 34. The output of driver circuit 36 is coupled to the gate electrode of output pulldown transistor 33. The output for the output buffer of FIG. 3 is taken from the junction of series connected transistors 33 and 34. Transistors 33 and 34 are coupled between voltage terminal $V_{DD}$ and ground.

By now it should be appreciated that there has been provided a clocked driver circuit which has high speed operation and yet uses low power. DC power paths from $V_{DD}$ to ground have been eliminated by carefully gating transistors within the driver circuit. In addition, bootstrapping is used to insure that the output of the driver circuit approaches voltage $V_{DD}$. The high speed, lower power consumption driver circuit is useful in forming an output buffer which has a TTL compatible output. The total speed-power product improvement of the output buffer is believed to approach 100.

By way of example only, the following is a list of device sizes for the transistors used in the output buffer. The device sizes in driver circuit 35 are the same as the device sizes in driver circuit 36 and are noted below using the reference numerals of the driver circuit of FIG. 1. The device sizes are given as a ratio of the transistor width to length in microns.

Transistor 1: 5/3.5
Transistor 2: 5/3.5
Transistor 4: 20/3.5
Transistor 5: 30/3.5
Transistor 6: 10/3.5
Transistor 7: 5/3.5
Transistor 8: 18/3.5
Transistor 9: 50/3.5
Capacitor 10: 40/20
Transistor 11: 125/3.5
Transistor 12: 75/3.5
Transistor 13: 5/5
Transistor 14: 15/5
Transistor 15: 15/5
Transistor 31: 6/30
Transistor 32: 6/30
Transistor 33: 1000/4
Transistor 34: 1000/4.

I claim:

1. A high speed driver circuit having field effect transistors and a first and a second voltage node, comprising: a first pair of transistors connected in series between the first and second voltage nodes and having a first and a second control electrode and having an output node formed between the first pair of transistors, the first control electrode being coupled to a clocking signal, the second control electrode being coupled to a precharge signal; a second pair of transistors coupled in series between the first and second voltage nodes and having a first and a second control electrode and providing an output, the first control electrode being coupled to the precharge signal and the second control electrode being coupled to the output of the first pair of transistors; a third pair of transistors coupled between an enable signal input and the output of the second pair of transistors and having a first and a second control electrode and providing an output, the first control electrode being coupled to the precharge signal and the second control electrode being coupled to the clocking signal; an inverter having an input and an output, the input being coupled to the enable signal input; a fourth pair of transistors coupled between the first and second voltage nodes and having a first and a second control electrode and an output, the second control electrode being coupled to the output of the second pair of transistors; a fifth pair of transistors coupled between the clocking signal and the second voltage node and having a first and a second control electrode and an output, the first control electrode being coupled to the output of the third pair of transistors and the second control electrode being coupled to the output of the inverter, the output of the fifth pair of transistors being coupled to the first control electrode of the fourth pair of transistors; capacitor means coupled between the output of the fourth pair of transistors and the first control electrode of the fourth pair of transistors; a first transistor coupled from the output of the third pair of transistors and the second voltage node and having a control electrode coupled to the output of the inverter; a sixth pair of transistors coupled between the first and second voltage nodes and having a first and a second control electrode and an output, the first control electrode being coupled to the output of the fifth pair of transistors, the second control electrode being coupled to the output of the second pair of transistors; and a second transistor coupled between the output of sixth pair of transistors and the second voltage node and having a control electrode coupled to the output of the inverter.

2. The high speed driver circuit of claim 1 being coupled with a second high speed driver and an output inverter to form an output buffer, the output inverter having a first and a second control electrode, the first control electrode being coupled to the output of the high speed driver circuit of claim 1 and the second control electrode being coupled to the output of the second high speed driver.

3. A high speed driver circuit having inputs for receiving a clocking signal, a precharge signal, and an enable signal, also having a first and a second voltage node, comprising: a first node; first means coupled between the enable signal input and the first node for precharging the first node; second means coupled to the first node and being enabled by the precharge signal and the clocking signal to discharge the first node; an inverter coupled to the enable signal input for providing an inverted enable signal output; third means coupled to the first node for maintaining the first node in a discharged condition when the third means is enabled by the output of the inverter; a second node; fourth means coupled to the second node for precharging the second node; fifth means having an output coupled to the second node for boosting the precharging of the second node, the fifth means having an input coupled to the second means; sixth means coupled to the second node for discharging the second node when the sixth means is enabled by the output of the inverter; and output means providing an output for the high speed driver circuit and having a first and a second input, the first input being coupled to the second node and the second input being coupled to the second means.

4. The high speed driver circuit of claim 3 further including seventh means coupled to the output means and having an input coupled to the output of the inverter to maintain the output in a static state when the seventh means is enabled by the output of the inverter.

5. The high speed driver circuit of claim 3 further including a second high speed driver circuit and a pair of transistors coupled in series between the first and second voltage nodes and having a first and a second input, the first input being coupled to the output of the output means and the second input being coupled to the output of the second high speed driver circuit.

6. The circuit of claim 5 wherein the enable signal input of the second high speed driver circuit is coupled to the inverter output.

7. The circuit of claim 6 further including a first depletion type transistor having a gate, a source, and a drain, the drain being coupled to the first voltage node, the source being coupled to the first input of the pair of transistors, the gate being coupled to the source; and a second depletion type transistor having a gate, a drain and a source coupled to the gate and to the second input of the pair of transistors, the drain of the second depletion type transistor being coupled to the first voltage node.

* * * * *